United States Patent
Fautz

(10) Patent No.: US 6,566,876 B2
(45) Date of Patent: May 20, 2003

(54) METHOD FOR TR INDEPENDENT MULTI-SLICE (TRIM) IMAGING

(75) Inventor: Hans-Peter Fautz, Freiburg (DE)

(73) Assignee: Universitätsklinikum Freiburg (DE)

( * ) Notice: Subject to any disclaimer, the term of this patent is extended or adjusted under 35 U.S.C. 154(b) by 0 days.

(21) Appl. No.: 10/185,981

(22) Filed: Jun. 28, 2002

(65) Prior Publication Data
US 2003/0016016 A1 Jan. 23, 2003

(30) Foreign Application Priority Data
Jul. 10, 2001 (DE) .......................... 101 33 491

(51) Int. Cl.⁷ .................................. G01V 3/00
(52) U.S. Cl. ......................... 324/309; 324/307
(58) Field of Search ............... 324/309, 307, 324/306, 312, 314, 300

(56) References Cited

U.S. PATENT DOCUMENTS 5,298,862 A    3/1994   Hennig
6,097,185 A  * 8/2000   Watanabe et al. ........... 324/309

\* cited by examiner

*Primary Examiner*—Edward Lefkowitz
*Assistant Examiner*—Brij B. Shrivastav
(74) *Attorney, Agent, or Firm*—Walter A. Hackler

(57) ABSTRACT

An imaging multi-slice NMR method for recording N slices (N>1) wherein for complete image reconstruction, recording in m individual steps (m>1) is carried out, wherein the recording of each step of each slice is carried out within a time period TA, is characterized in that the recording is carried out in r repetition cycles (r>m) and that during each of these repetition cycles, data from P slices (P<N) is acquired, wherein for recording the complete data set of m*N recording steps, the number of repetition cycles is r=m*N/P, wherein possible steps which remain due to non-dividability of m*N by P are attached or ignored, wherein spatial encoding can be different during each repetition step from slice to slice as long as after r repetitions for each slice all m spatial encoding steps are recorded, and wherein also the position of the P slices within the volume under investigation defined by the total number N of slices to be recorded can be different as long as the data for reconstructing N slices within the volume under investigation is complete after termination of the recording. In this fashion, it is possible to make the number of slices recorded in one measurement independent of the repetition time which determines the image contrast.

9 Claims, 5 Drawing Sheets

METHOD FOR TR INDEPENDENT MULTI-SLICE (TRIM) IMAGING

The invention concerns an imaging multi-slice nuclear magnetic resonance (NMR) method for recording N slices (N>1) from a volume under investigation in a measuring object, wherein for complete image reconstruction, recording is carried out in m individual steps (m>1), wherein the recording of each recording step of each slice takes the time TA.

A method of this type is known e.g. from DE 41 37 217 A1.

BACKGROUND OF THE INVENTION

Imaging nuclear magnetic resonance tomography produces two-dimensional slice images of an object under investigation. To image a volume, sets of parallel slices are obtained which stretch the spatial direction in an orthogonal direction relative to these slices.

For recording an image, generally m partial steps are required in which n complex data points are recorded each. Image reconstruction from the m x n data points is carried out, depending on the spatial encoding, by means of a two-dimensional Fourier transformation (2DFT) [1] or by two-dimensional filtered reverse projection [2-3]. The magnetic field is varied in each case between two partial steps through temporally variable magnetic field gradients. In the 2DTF method, the variation is based on the switching of so-called phase encoding gradients. In this case, the partial steps are therefore also called phase encoding steps. Generally, a slice is excited several times for recording several phase encoding steps. The time between two excitations, the so-called repetition time TR, is in the magnitude of the NMR relaxation times and determines the image contrast.

Slices of a certain thickness can be selectively excited by means of frequency-selective (narrow band) RF pulses, which are irradiated under a constant magnetic field gradient. Multi-slice imaging defines a class of methods, which excite and read out successively several slices within a repetition time TR [4]. In each repetition, another phase encoding step of each of these slices is recorded (FIG. 1, left half of the illustration). The slices, which are excited in a repetition period, define a volume. This remains identical until complete recording of all slices of the volume and is excited in the same slice sequence in each repetition period.

The time interval between two successive excitations of the same slice equals the repetition time TR for all slices. All slices therefore have identical image properties. The volume is recorded in m repetitions within almost the same recording time required for recording one slice with equivalent image properties.

Modification of the conventional multi-slice method is known from the above-cited DE 41 37 217 A1. The slice positions of two phase encoding steps, which are principally associated with one, slice and recorded successively, differ by an increment, which is small compared to the slice thickness. Spatial distribution of the phase encoding steps permits reconstruction of additional overlapping slices without additional data recording through corresponding combinations of the phase encoding steps [5,6].

This method eliminates gaps between the reconstructed slices. In the conventional method, gaps are produced by the fact that the pulses used within a repetition time must have a certain separation from each other due to their mutual influence from the pulse slopes [7,8]. To obtain continuous or even overlapping cover of a volume, two or more mutually offset volumes must be recorded in sequential measurements.

The number of slices, which can be recorded in a conventional multi-slice measurement, is limited by the repetition time TR with given contrast. If this number is not sufficient to cover a desired volume, further slices must be recorded sequentially in subsequent measurements. This requires an integral multiple in measuring time. Further disadvantages for the examination can result if it is not possible to carry out e.g. a second measurement in the same respiratory rest position.

Larger volumes exceeding the homogeneity of the coil sensitivity or of the B field must also be recorded sequentially. The measuring object is displaced between the recordings. Continuous recording e.g. under continuous advance of the measuring object is currently not possible with a multi-slice technology.

SUMMARY OF THE INVENTION

In contrast thereto, it is the object of the present invention to improve a method of the above-described type such that the above-discussed disadvantages are eliminated. The invention is supposed to present in particular a new multi-slice method with the aim of making the number of slices recorded in one measurement independent of the repetition time which determines the image contrast.

In accordance with the invention, this object is achieved in an effective fashion in that the recording is carried out in r repetition cycles (r>m) and data from P slices (P<N) is acquired during each of these repetition cycles, wherein for recording the complete data set of m*N recording steps, the number of repetition cycles is r=m*N/P, wherein possible steps which remain due to the non-divisibility of m*N by P are attached or ignored, wherein the spatial encoding during each repetition step can but need not necessarily vary from slice to slice as long as all m spatial encoding steps are recorded for each slice after r repetitions, and wherein also the position of the P slices can be but need not necessarily be different within the investigation volume defined by the total number N of slices to be recorded as long as the data for reconstruction of N slices within the investigation volume is complete after termination of the recording.

BRIEF DESCRIPTION OF THE DRAWINGS

Further advantages of the invention can be extracted from the description and the drawing. The features mentioned above and below can be used in accordance with the invention either individually or collectively in any arbitrary combination. The embodiments shown and described are not to be understood as exhaustive enumeration but rather have exemplary character for describing the invention. The invention is shown in the drawing and is explained in more detail by means of embodiments.

DETAILED DESCRIPTION

The new method is called below TR independent multi-slice (TRIM). A special application of the method is the recording of multiple slices with continuous advance of the measuring object.

The use of the position-variable phase encoding can make the separation of the pulses used in a repetition time independent of the separation of the recorded slices. The method therefore offers the new possibility to record within one measurement slices with any close separation or overlapping slices.

The invention can be applied to all conventional multi-slice methods.

Figure 1:
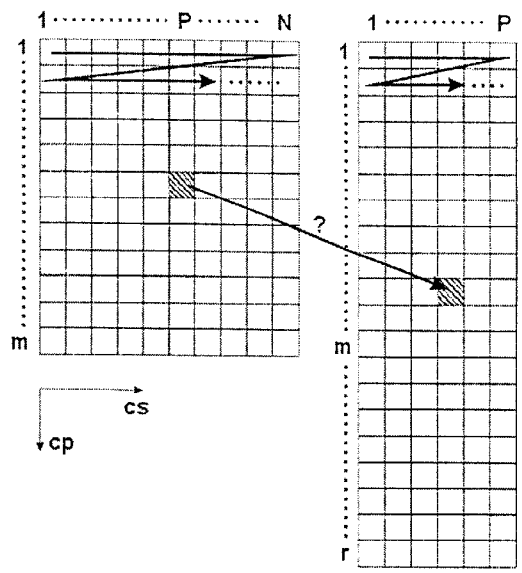
FIG. 1: (Nxm) and (Pxr) matrix with N*m entries each for the phase encoding steps of a multi-slice experiment with N slices. The phase encoding steps recorded within one repetition are registered in lines. Conventionally (left-hand side), each column corresponds to a slice position and each line to the value of a used phase encoding gradient. The phase encoding steps are clearly characterized by the line and column indices. The TRIM method images the phase encoding steps on a (Pxr) matrix if P is the number of slices excited in one repetition (right-hand side)

If the number of slices N to be recorded is predetermined, a total of (N*m) phase encoding steps must be recorded. The total recording time is $T_{ges}=N*m*TA$ for a time TA required for recording a phase encoding step. In the conventional multi-slice method, all N slices are excited successively within a repetition time. The interval TR which determines the contrast is TR=N*TA. In the new TRIM method, the interval which determines the contrast is reduced from TR=N*TA to TR=P*TA with P<N. To record all phase encoding steps, the number of repetitions must be increased from m to r through reduction of the excitations per repetition such that r*P=N*m. The total recording time remains constant. The object can be defined as shown below: A (Pxr) matrix into which the phase encoding steps of a repetition are dotted in lines must be designed such that TR=P*TA is constant in all slices during the entire recording (FIG. 1).

Figure 2:
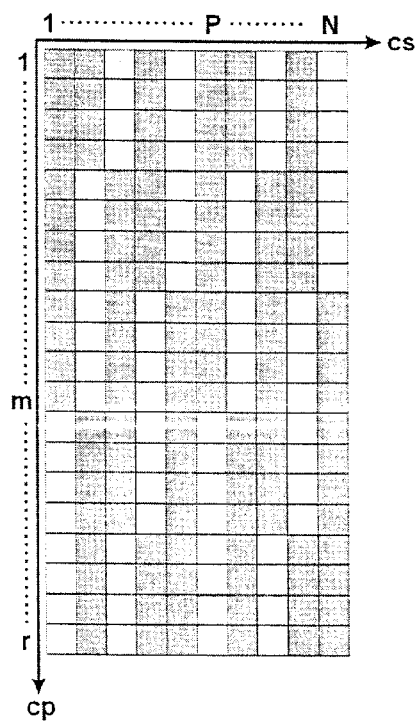
FIG. 2: Occupation of a design matrix for recording all phase encoding steps for N slices (grey box) in a measurement with P excitations per repetition and r repetitions. The matrix is worked in lines wherein the white boxes are omitted. It shows the time grid for recording the phase encoding steps.

This problem can be solved through combinatorial analysis in that the total number of the (N*m) required recording steps is filled into a matrix of the size (Nxr). P steps are filled in each line and m steps are filled in each column (FIG. 2). If P>N/2 and hence r<2m, the object can be achieved in that a corresponding number of gaps is inserted instead of the recording steps. The number of gaps in the direction of the lines is (N−P) and in the direction of the columns (r−m).

Figure 3:
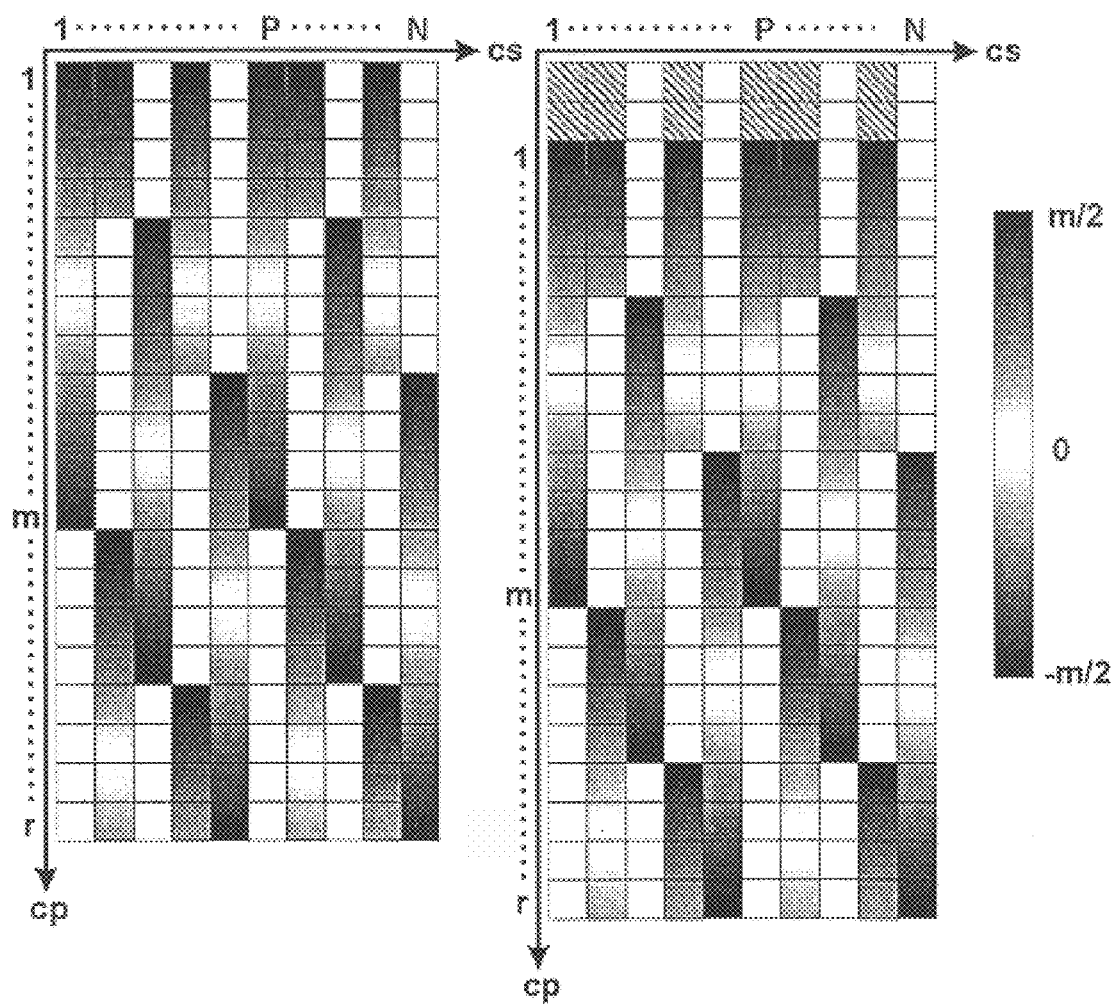
FIG. 3: The temporal recording pattern from FIG. 2 showing the phase encoding trajectory for each slice through grey encoding. The phase encoding trajectory is selected for each slice such that image artifacts are minimized due to different repetition times. Insertion of dummy echoes (shaded boxes) is a further method for reducing artifacts (right-hand side)
Figure 4:
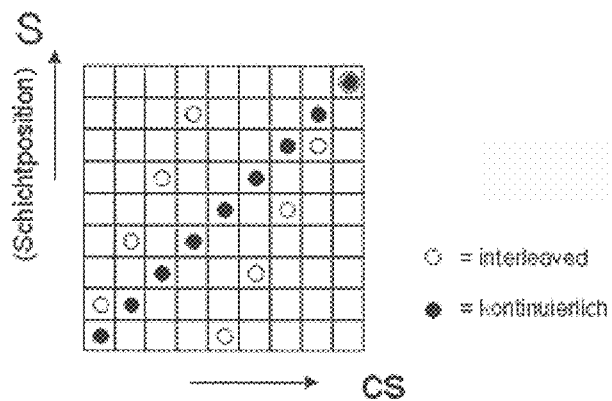
FIG. 4: Look-up table for association of the slice counter "cs" to the geometric slice positions.

The variables cp and cs from FIG. 2 count the phase encoding steps and the slices respectively. Association with the corresponding k spatial coordinates (for cp) and geometric positions of the slices (for cs) can be arbitrary as long as the condition is met that all phase encoding steps are recorded for all slices. Each cs is associated with a certain slice in free spatial association (FIG. 3). The association of the respective phase encoding step to the slice cs during the recording cp is free. The phase encoding of the recording steps recorded in step cp can be different from slice to slice.

For (N=P) the TRIM method merges into the conventional multi-slice method. If N is a multiple of P, the TRIM method can be based as special case to a sequential conventional recording.

The total number of all phase encoding steps (N*m) must not necessarily be a multiple of P. The method can be used for any P (1<P<N). Generally, an incomplete last line is attached to the (Pxr) matrix from FIG. 1.

Imaging properties with respect to the repetition time determined by the design matrix The occupation of the design matrix brings the recording of all phase encoding steps into a time grid arranged according to the slice association. The time between two excitations of the same slice determines the substantial image properties. Exact fulfillment of the condition TR=P*TA is not possible for all recording steps. The gaps in the direction of the columns produce at least one interval, wherein this slice has a longer TR. The number of these longer TR intervals can be minimized in that the gaps in the cp direction are selected to be as continuous as possible.

Figure 5:
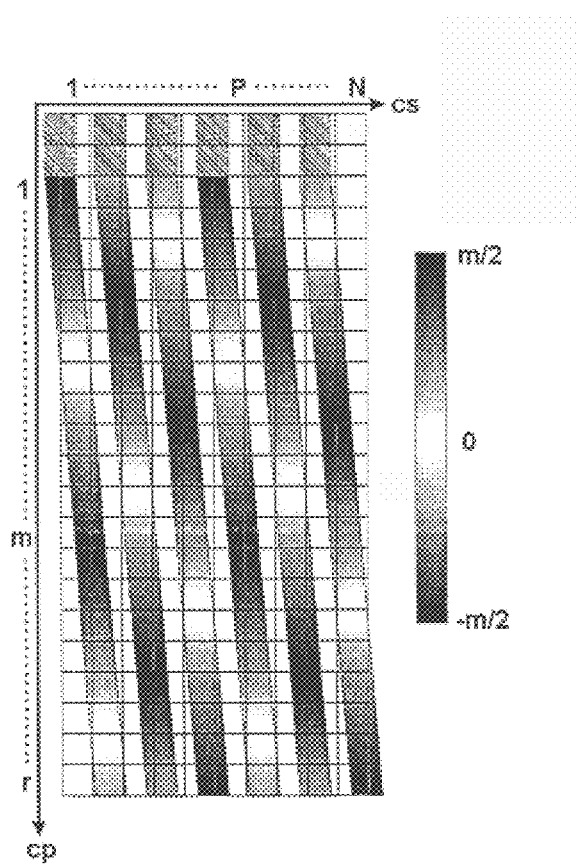
FIG. 5: TRIM excitation scheme thereby using positionally variable (ramped) phase encoding. The phase encoding steps associated with a slice vary about their central position by half a slice separation.

To prevent artifacts the same methods are used as for the first repetitions in the conventional multi-slice method. The phase encoding trajectory of each slice is adjusted such that echoes are encoded after a longer TR interval for the outer k space regions in each case. This minimizes artifacts in the image due to the properties of Fourier imaging (FIG. 5; left-hand side). The use of so-called dummy echoes is another possibility to reduce artifacts. These are signals which are produced, however, not used for image reconstruction. Due to the magnetization preparation of the dummy repetitions in FIG. 5 (right-hand side), the signal behavior of the recorded echoes is almost identical to that of the conventional method.

This combined representation of the design matrix of occupation and phase encoding trajectory permits very easy reading of the resulting image properties of a TRIM experiment.

Extension of the Method to Continuous Scanning

In general, the pulses used in a TRIM repetition time are not equidistantly distributed along the slice direction (FIG.

2). Moreover, the separations between the pulses differ for different repetitions. Due to the varying influences from the edges of the non-equidistant pulses, the individual phase encoding steps can have different signal intensities than others [8]. This can produce artifacts if the signal fluctuations are large enough. On the other hand, individual slices have in total a slightly higher image intensity than other slices from the slice set.

This can be prevented in that the slice position as in RAMP [5,6]—is continuously changed. The phase encoding steps associated with a slice are varied in each case by half the separation from the subsequent slice around their central slice position. FIG. 5 shows that the (N−P) gaps in each line can be used to distribute the P pulses in each repetition in an equidistant fashion across the entire measuring volume in the slice direction. The position-variable phase encoding does permit use of equidistant pulses, however, also the slice profile changes by this type of phase encoding [4,9,10].

Applications

Independent Selection of Slice Number and Repetition Time TR

A design matrix as shown in FIG. 3 can be constructed for any selection of P and N with the following properties. The holes are continuously distributed to one column and continuously connected across the columns. The phase encoding trajectory is divided for each slice into one trajectory or a maximum of two partial trajectories with constant repetition time $TR_{TRIM}$ in each case. These are encoded linearly from both ends of the k space matrix towards the center. Conventional repetition times of more than 50 ms produce the steady state signal after a few echoes. TRIM images therefore have the same image contrast as conventional images, which are characterized by the repetition, time $TR_{TRIM}$. The repetition time $TR_{TRIM}$ is independent of the number of recorded slices N and determined merely by the free parameter P. Compared to a conventional N slice measurement, the repetition time which determines the image contrast can be reduced by a factor P/N:

$$TR_{TRIM} = \frac{P}{N} * TR_{konv}$$

Independent selection of slice number and TR permits optimum adjustment of the number of slices recorded in one measurement with only one sequence to a volume to be covered, e.g. the extension of an organ. A limited total recording time, e.g. a respiratory rest period can be optimally utilized to record the largest possible number of slices independent of the image contrast. This permits e.g. also recording before and after administration of contrast medium with constant slice number with different recording time.

Multi-Echo Sequences

Figure 6:
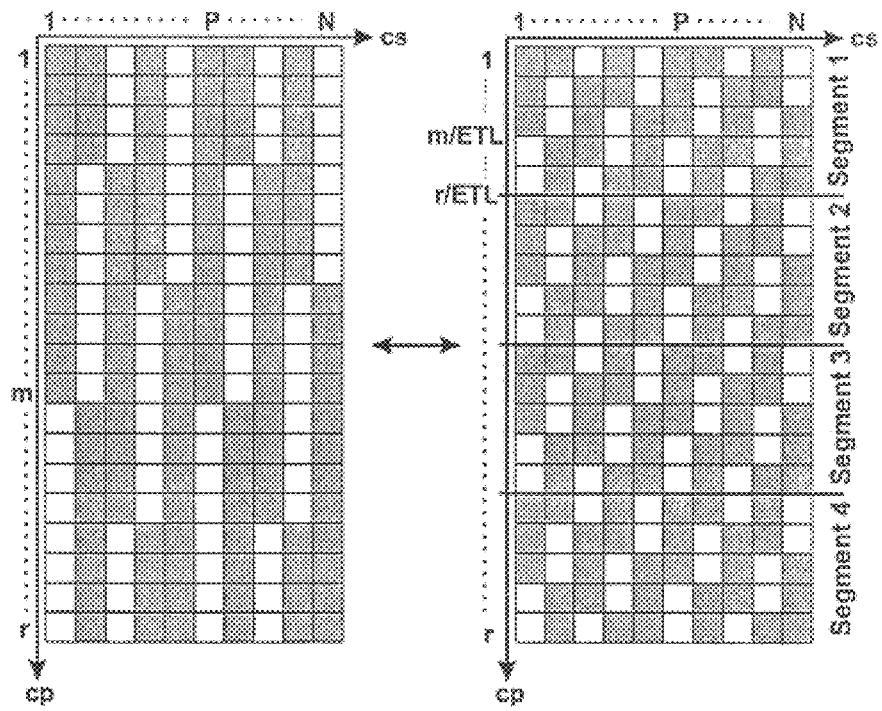
FIG. 6: If the number of gaps per column is a multiple of the echo train length ETL, the design matrix (left-hand side) can be divided in the cp direction into ETL identical segments (right-hand side). It is then sufficient to design a segment. The entire matrix is obtained by copying this segment in the phase encoding direction. The phase encoding trajectories of the slices are independent of the segments.

In multi-echo sequences, several echoes are generated after only one excitation to reduce the number of required excitations or to generate several images with different contrast in one measurement [11-13]. The number of the phase encoding steps recorded per excitation is echo train length (ETL). The number of phase encoding steps recorded per slice is an integral multiple of the echo train length m/ETL=n. Generalization of the TRIM method to multi-echo sequences is particularly simple if the number of gaps in the design matrix per column (r−m) is also an integral multiple of the echo train length (r−m)/ETL=l. In that case, also the number of repetitions r is an integral multiple of the echo train length r/ETL =n+l. The entire design matrix can be divided into ETL identical segments. The design of the matrix is based on the design of a segment with (n+l) repetitions. The entire matrix is obtained through copying this segment in the cp direction (FIG. 6). The different segments correspond to the various echo signals within an echo train. Association of cp to the k space coordinates is independent of the segments. Association of cs to the geometric slice positions is identical for the ETL segments.

Multi-echo sequences are more time-efficient than single-echo sequences due to the minimum echo distances and additionally they are particularly suited for use of fat saturation and other saturation techniques. In T1-weighted multi-echo sequences, the number of slices possible within one TR is inherently greatly limited. TRIM offers the possibility of flexible slice selection also with multi-echo sequences.

Recording of Overlapping Slices

The method shown in FIG. 5 is suited not only for use of equidistant pulses in TRIM imaging but also for recording any overlapping slices by means of a multi-slice method. The phase encoding steps associated with a slice and recorded in subsequent repetitions, differ in each case by an increment $\delta z=\Delta z/m$. Z is thereby the slice separation and m the number of phase encoding steps per slice. As shown in FIG. 5, the separation between the pulses used within a TRIM repetition is larger by a factor N/P than the slice separation z.

$$\Delta z = m * \delta z = \frac{P * r}{N} * \delta z = \frac{P}{N} * \Delta \zeta$$

With predetermined separation of the (non-overlapping) pulses, the slice separation can be arbitrarily reduced by increasing the number of measured slices. The slices will overlap increasingly, their image contrast which is determined by $TR_{TRIM}$ and hence by P is maintained.

Continuous "Whole Body" Multi Slice Imaging

For certain applications such as e.g. the representation of extremities or of the bone skeleton, the volume to be covered is a multiple of the measurement window which is limited by the homogeneity of the magnetic field and the coil sensitivity. Instead of covering the total volume sequentially with individual measurement windows, it is also feasible to displace the total volume continuously across the measurement window like in spiral CT. It is thereby desired to be able to use the measurement window at any time by a multi slice technology for data acquisition. The problem can be based on the original TRIM problem. In each repetition period P, phase encoding steps are recorded from a subvolume which extends over part of the total volume of n slices and is displaced only gradually.

Figure 7:
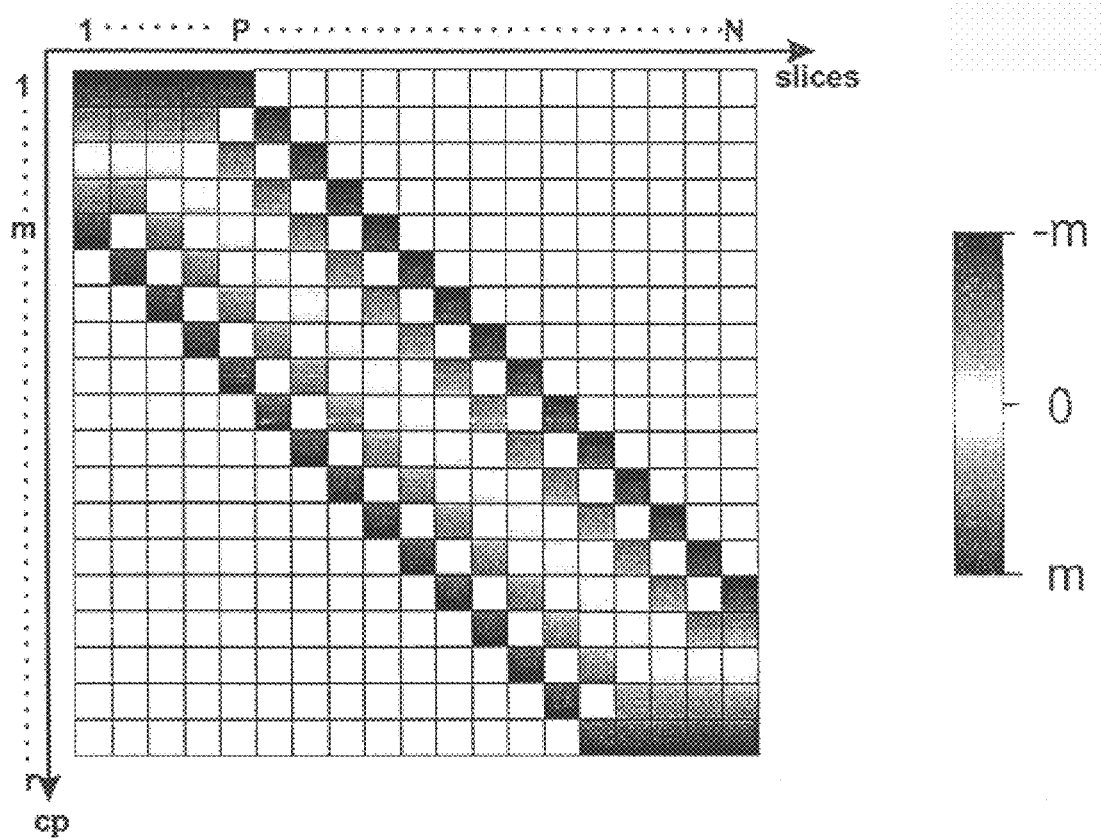
FIG. 7: Representation of a multi-slice experiment with gradual advance of the measurement window through the design matrix.
Figure 8:
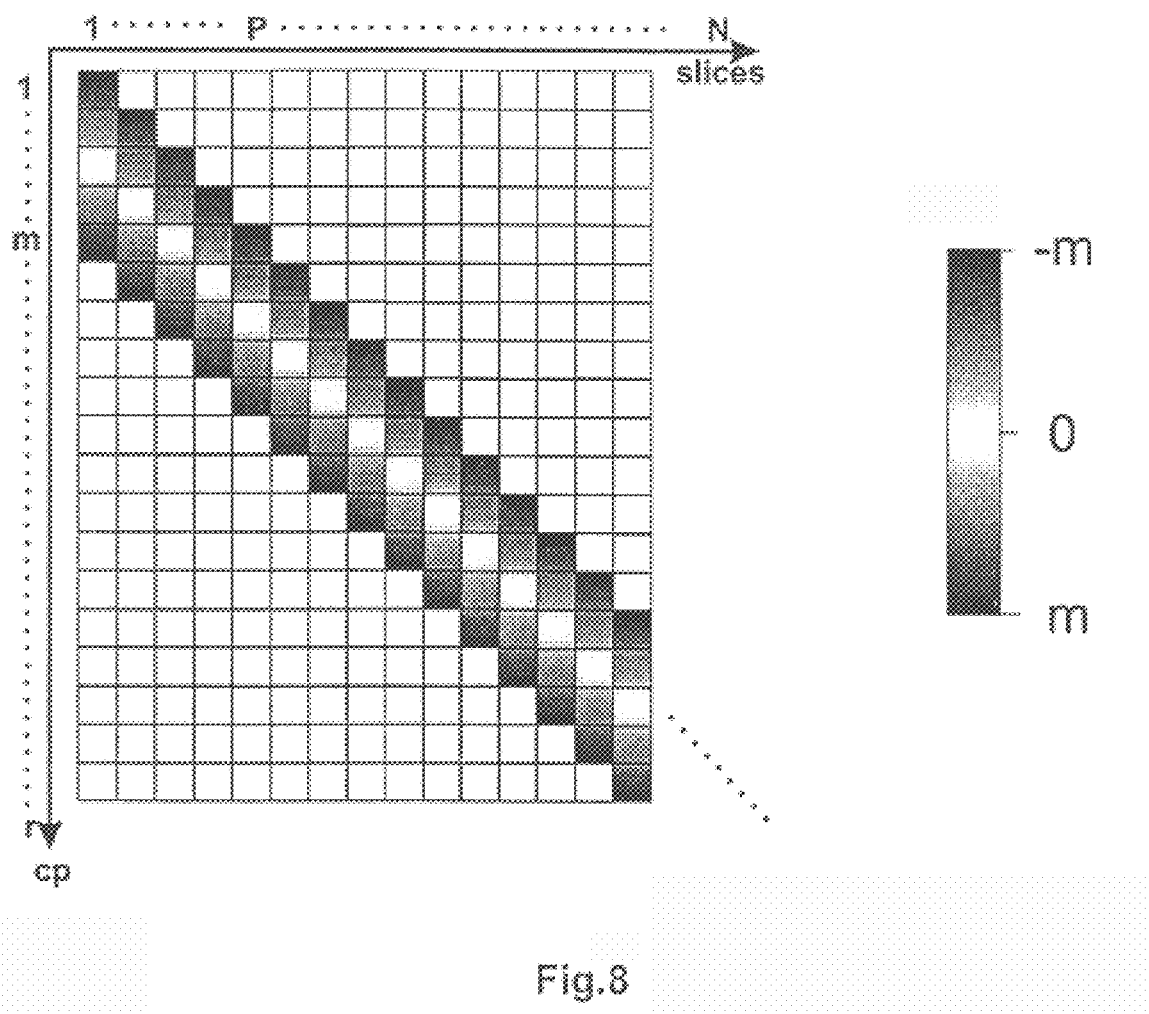
FIG. 8: Alternative acquisition scheme with gradual advance of the measurement window through the design matrix. In comparison to the acquisition scheme shown in FIG. 7 at the beginning and at the end of the acquisition the number of slices recorded in each repetition differs from P. Variations in the repetition times may be compensated using fill times or the edge slices of the total volume may be discarded due to different image properties in these slices. The main advantage of this acquisition scheme is the continuous acquisition of phase encoding steps along the phase encoding direction of each slice. In comparison to the acquisition scheme shown in FIG. 7 long time distances between the acquisitions of phase encoding steps from the same slice are avoided and artifacts arising from signal variations due to these gaps are avoided.

This produces a design matrix of the type shown in FIG. 7 and FIG. 8. Segmentation of m phase encoding steps per slice into P segments would provide a solution if P slices are excited in each repetition time. For complete recording of all slices, the slices excited in one repetition time are displaced across one segment by one slice position in each case.

This advance speed of P slices in m phase encoding steps is a maximum. Slower advances produce excessive acquisition of data. The additionally recorded data can be used for averaging or acquisition of intermediate slices. Depending on the implementation, selection between improved slice resolution or increased signal-to-noise ratio is possible thereby impairing the advance speed.

Continuous advance of the measuring object produces positionally variable phase encoding if the slice excitation frequencies are constant within one segment. Carrying along of these frequencies over a slice separation within one segment produces conventional positionally constant phase encoding.

QUOTATIONS FROM LITERATURE

[1] Dössel, Bildgebende Verfahren in der Medizin, Springer, chap.13.5, S.315 ff, 2000
[2] Dössel, Bildgebende Verfahren in der Medizin, Springer, chap.13.5, S.319 ff, 2000
[3] Scheffler K., et al., *Magn. Reson. Med.,* 40, 474–480, 1998
[4] Vlaardingerbroek, den Boer, Magnetic Resonance Imaging, Springer, 80f, 1999
[5] Hennig J., *Journ. of Magn. Reson. Imag.,* 3, 425–432, 1993
[6] Hennig J., *Patent DE* 41 37 217, 1993
[7] Bradley W. G., et al., *AJNR,* 8(6), 1057–1062,1987
[8] Kucharczyk W., et al., *AJNR,* 9(3), 443–451,1988
[9] Fautz H. -P., et al., *Proc. ISMRM* (2000), 1725, 2000
[10] Fautz H. -P., et al., *Proc. ISMRM* (2001), 233, 2001
[11] Mansfield P., et al., *J.Phys.C:Solid State Phys., Vol.* 10, 55–58, 1977
[12] Hennig J., et al., *Magn. Reson. Med.,* 27, 823–833, 1986
[13] Feinberg D. A., et al., *Radiology,* 181(2), 597–602, 1991

I claim:

1. Imaging multi-slice nuclear magnetic resonance (NMR) method for recording N slices (N>1) from a volume under investigation in a measuring object, wherein for complete image reconstruction recording in m individual steps (m>1) is carried out wherein the recording of each recording step of each slice is carried out within a time period TA, the method comprising the step of:

carrying out the recording in r repetition cycles (r>m) and during each of these repetition cycles, data from p slices (P<N) is acquired;

wherein for recording the complete data set of m*N recording steps, a number of repetition cycles is r=m*N/P, wherein possible steps which remain due to the non-divisibility of m*N by P are attached or ignored;

wherein spatial encoding during each repetition step can vary from slice to slice as long as all m spatial encoding steps are recorded for each slice after r repetitions; and and wherein also the position of the P slices can be different within the investigation volume defined by the total number N of slices to be recorded as long as the data for reconstruction of N slices within the investigation volume is complete after termination of the recording.

2. Method according to claim 1, wherein a gradient echo sequence is applied which is formed either as spoiled FLASH, refocused FLASH, reversed FLASH or true FISP.

3. Method according to claim 1, wherein spin echo sequences are applied.

4. Method according to claim 1, wherein RARE(TSE) sequences are applied such that in each individual step several differently spatially encoded data is recorded.

5. Method according to claim 1, wherein the sequence of repetitions is carried out such that a repetition time P*TA which is as constant as possible is obtained for each slice.

6. Method according to claim 5, wherein the recording is carried out in each slice in coherent consecutive repetitions.

7. Method according to claim 1 wherein the slice positions of the P slices are continuously changed from one repetition to the next such that after recording at least N layers can be reconstructed within the volume under investigation.

8. Method according to claim 1 spatial encoding is applied according to the two-or more-dimensional Fourier transform method.

9. Method according to claim 1, wherein spatial encoding is applied according to the method of filtered reverse projection.

* * * * *